United States Patent
Kaynak et al.

(10) Patent No.: US 12,494,801 B1
(45) Date of Patent: Dec. 9, 2025

(54) ITERATIVE BIT FLIP DECODING UTILIZING DIFFERENT BIT FLIP STATES

(71) Applicant: MICRON TECHNOLOGY, INC., Boise, ID (US)

(72) Inventors: Mustafa N. Kaynak, San Diego, CA (US); Mariano Burich, San Diego, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 18/783,892

(22) Filed: Jul. 25, 2024

(51) Int. Cl.
*H03M 13/00* (2006.01)
*H03M 13/11* (2006.01)
*H03M 13/37* (2006.01)

(52) U.S. Cl.
CPC ... *H03M 13/1108* (2013.01); *H03M 13/3746* (2013.01)

(58) Field of Classification Search
CPC ......... H03M 13/1108; H03M 13/3738; H03M 13/3723; H03M 13/2927; H03M 13/3746
See application file for complete search history.

(56) References Cited

U.S. PATENT DOCUMENTS

| | | | | |
|---|---|---|---|---|
| 10,447,301 | B2 * | 10/2019 | Hanham | H03M 13/2906 |
| 11,108,407 | B1 * | 8/2021 | Lu | H03M 13/1111 |
| 11,146,289 | B2 * | 10/2021 | Bhatia | H03M 13/1108 |
| 11,377,845 | B2 * | 7/2022 | Ahmadi | E04B 1/8209 |
| 11,456,757 | B2 * | 9/2022 | Asadi | H03M 13/1128 |
| 11,469,775 | B2 * | 10/2022 | Savin | H03M 13/1108 |
| 11,923,867 | B1 | 3/2024 | Parthasarathy et al. | |
| 12,034,455 | B2 * | 7/2024 | Kumar | G06F 11/1048 |
| 12,316,345 | B2 * | 5/2025 | Kwok | H03M 13/1108 |

OTHER PUBLICATIONS

U.S. Appl. No. 18/419,352, filed Jan. 22, 2024.

* cited by examiner

*Primary Examiner* — Esaw T Abraham
(74) *Attorney, Agent, or Firm* — Tarolli, Sundheim, Covell & Tummino LLP (57) ABSTRACT

A codeword is received and stored in a first data structure to be decoded by flipping one or more of a plurality of bits over multiple iterations by a bit flip decoder, an error check is executed on the codeword, by a controller, to identify error bits from the plurality of bits, and the state of an error bit is flipped from one of the identified error bits if parity check (PC) violations associated with the error bit meet or exceed a PC violation threshold associated with a bit flip state of the error bit, where the bit flip state is selected from one of a first bit flip state with a first PC violation threshold and a second bit flip state with a second PC violation threshold different than the first PC violation threshold. The current state of the error bit is stored in a second data structure.

20 Claims, 6 Drawing Sheets

FIG. 1

| Iteration | Syndrome iteration Start | Syndrome iteration End |
|---|---|---|
| 0 | 604 | 300 |
| 1 | 300 | 76 |
| 2 | 76 | 46 |
| 3 | 46 | 38 |
| 4 | 38 | 36 |
| 5 | 36 | 34 |
| 6 | 34 | 32 |
| 7 | 32 | 30 |
| 8 | 30 | 30 |
| 9 | 30 | 50 |
| 10 | 50 | 24 |
| 11 | 24 | 12 |
| 12 | 12 | 12 |
| 13 | 12 | 28 |
| 14 | 28 | 18 |
| 15 | 18 | 12 |
| 16 | 12 | 12 |
| 17 | 12 | 28 |
| 18 | 28 | 18 |
| 19 | 18 | 12 |
| 20 | 12 | 6 |

STALL PATTERN 202

ERROR CORRECTOR 113

| | BIT #3 | BIT #2 | BIT #1 | BIT #0 | |
|---|---|---|---|---|---|
| ORIGINALLY READ CODEWORD | 0 | 1 | 1 | 0 | ← 310 |

| | BIT #3 | BIT #2 | BIT #1 | BIT #0 | |
|---|---|---|---|---|---|
| CURRENT STATE OF CODEWORD | 1 | 1 | 1 | 1 | ← 320 |
| MATCHED/ UNMATCHED | 1 | 0 | 0 | 1 | ← 330 |
| PI FLIPPED STATUS | 1 | 0 | 1 | 0 | ← 340 |

FIG. 4

| | MATCHED/ UNMATCHED | PI FLIPPED STATUS | PC VIOLATION THRESHOLD |
|---|---|---|---|
| BIT FLIP STATE #1 | 0 | 0 | 1 |
| BIT FLIP STATE #2 | 0 | 1 | 4 |
| BIT FLIP STATE #3 | 1 | 0 | 2 |
| BIT FLIP STATE #4 | 1 | 1 | 3 |

ITERATIVE BIT FLIP DECODING UTILIZING DIFFERENT BIT FLIP STATES

TECHNICAL FIELD

The present disclosure generally relates to error correction in memory subsystems, and more specifically, relates to iterative bit flip decoding utilizing different bit flip states.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various examples of the disclosure. The drawings, however, should not be taken to limit the disclosure to the specific examples, but are for explanation and understanding only.

DETAILED DESCRIPTION

This disclosure relates to iterative bit flip decoding during memory codeword retrieval and decoding from a memory system or subsystem. That is the bit flip decoder, upon detecting errors in states of one or more bits of a codeword, iteratively flips bits and rechecks the codeword for errors to attempt to resolve all bit errors in the codeword. In the present disclosure, an iterative bit flip decoder utilizes respective bit flip criteria for different bit flip states to mitigate bit flip stall conditions during codeword decoding. A bit flip stall condition is when the bit flip decoder detects an oscillating (multiple) back-to-back flip condition(s) for one or more bits of a codeword where the number of errors (e.g., parity check violations) resolved is not improved or is increased over multiple bit flip iterations.

A bit flip state can be based on whether or not a bit was flipped or was not flip in a previous bit flip iteration. In one example, the bit flip criteria for a given bit flip state can be whether or not a current bit flip criteria value is greater than or equal to a bit flip criteria threshold value associated with the given bit flip state. Each bit flip criteria value can be selected and associated with a given bit flip state, such that different bit flip states can have different or the same bit flip criteria threshold values for a given bit or for all bits. For example, the bit flip criteria can be whether or not a current number of parity check (PC) violations determined by a parity check for a given bit is greater than or equal to a threshold value of PC violations to allow for the flipping of a bit in the current bit flipping iteration. The threshold value of PC violations can have a different value (e.g., any of 1-4) based on the bit flip state of the given bit. For example, different PC violation threshold values can be assigned to whether the flipping of the bit occurred or did not occur in the previous bit flip iteration.

Additionally, the bit flip criteria can be different and/or take on a different value based on various bit flip states. For example, different bit flip states can be a function of both the flipping or not flipping of the bit flip in a previous iteration, and a matching (e.g., matched or unmatched) of the current state of the bit during the bit flipping decoding process, and the original state of the bit read from memory. That is different bit flip states can be a function of both a matched or unmatched state and a flipped or not flipped in a previous iteration state. Therefore, in this example, there can be four different bit flip states. That is matched/flipped in a previous iteration, matched/not flipped in a previous iteration, unmatched/flipped in a previous iteration, and unmatched/ not flipped in a previous iteration. Each bit flip state can have an associated bit flip criteria threshold value, such as an associated PC violation threshold value for each of a respective bit flip state. Employing different bit flip criteria for different bit flip states has been determined to mitigate stall conditions and to expedite bit flip correction by a bit flipping decoder.

Bit flip threshold values can be optimized based on machine learning/artificial intelligence inspired iterative algorithm. Bit flip threshold optimization can be done based on a cost metric such as codeword error rate (CWER) and/or average iteration count (avgIter) to deliver the best cost metric. Examination of bit flip decoder failures show that there are cases when bit flip decoder flips the same bits back and forth (oscillates) in consecutive iterations without overall improvement in error resolution. This usually happens when the bit flip decoder is stuck in a local minima and starts oscillating between different states. Without intervention, the bit flip decoder is unable to escape this oscillatory behavior. Some bit flip decoders utilize the same bit flip thresholds irrespective of whether a bit is flipped in the previous iteration(s) or not. The present disclosure allows for the setting of different bit flip thresholds on different bit flip states which can include both whether the bit was flipped in the previous iteration or not and whether the state of the bit matches or does not match the original data read from memory, which has shown to provide performance improvement for converging data to error free corrected data.

In one example, a first bit flip state and an associated flip bit criteria value is assigned to a matched state and a flipped in a previous iteration state, a second flip bit state and an associated flip bit criteria value is assigned to a matched state and a not flipped in a previous iteration state, a third bit flip state and an associated third bit flip criteria value is assigned to an unmatched state and a flipped in a previous iteration state, and a fourth bit flip state and an associated flip criteria value is assigned to an unmatched state and the not flipped in the previous iteration state. A bit flip criteria value could be a number of PC violations of a given bit for a codeword determined based on a parity check associated with the given bit. Each bit flip criteria can have a different PC violation threshold, which determines whether or not the bit will be flipped in the current iteration.

The greater than or equal to criteria is just one example of a criteria that could be employed as it is to be appreciated that a greater than value could be employed for flipping bits and a less than or equal value could be employed to not flip a bit. Other criteria such as a difference value may be used to determine whether or not to flip a bit in a current iteration.

A memory sub-system refers to a storage device, a memory module or some combination thereof. The memory sub-system includes a memory device or multiple memory devices that store data. The memory devices could be volatile or non-volatile memory devices. Some examples of a memory sub-system include high density non-volatile memory devices where retention of data is desired during intervals of time where no power is supplied to the memory device. One example of non-volatile memory devices is a not-AND (NAND) memory device. A non-volatile memory device is a package that includes a die(s). Each such die can include a plane(s). For some types of non-volatile memory devices (e.g., NAND memory devices), each plane includes a set of physical blocks, and each physical block includes a set of pages. Each page includes a set of memory cells, which are commonly referred to as cells. A cell is an electronic circuit that stores information. A cell stores at least one bit of binary information and has various logic states that correlate to the number of bits being stored. The logic states are be represented by binary values, such as '0' and '1', or as combinations of such values, such as '00', '01', '10' and '11'.

A memory device includes multiple cells arranged in a two-dimensional or a three-dimensional grid. In some examples, memory cells are formed on a silicon wafer in an array of columns connected by conductive lines (also referred to as bitlines, or BLs) and rows connected by conductive lines (also referred to as wordlines or WLs). A wordline has a row of associated memory cells in a memory device that are used with a bitline or multiple bitlines to generate the address of each of the memory cells. The intersection of a bitline and a wordline defines an address of a given memory cell.

A block refers to a unit of the memory device used to store data. In various examples, the unit could be implemented as a group of memory cells, a wordline group, a wordline or as individual memory cells. Multiple blocks are grouped together to form separate partitions (e.g., planes) of the memory device to enable concurrent blocks to take place on each plane. A solid-state drive (SSD) is an example of a memory sub-system that includes a non-volatile memory device(s) and a memory sub-system controller to manage the non-volatile memory devices.

The memory sub-system controller is configured/programmed to encode the host and other data, as part of a write block, into a format for storage at the memory device(s). Encoding refers to a process of generating parity bits from embedded data (e.g., a sequence of binary bits) using an error correction code (ECC) and combining the parity bits to the embedded data to generate a codeword. LDPC encoding refers to an encoding method that utilizes an LDPC code to generate the parity bits.

The LDPC code is defined by, among other things, a sparse parity-check matrix, alternatively referred to as an H matrix, denoted as H. Each row of the H matrix embodies a linear constraint imposed on a designated subset of data bits. Entries within the H matrix, either '0' or '1', signify the participation of individual data bits in each constraint. Stated differently, each row of the H matrix represents a parity-check equation, and each column corresponds to a bit in the codeword. During encoding, parity bits are generated using the embedded data along with the H matrix or generator matrix (which is the inverse of the H matrix). The generated parity bits are appended to the embedded data to generate an LDPC codeword. The LDPC codeword includes the embedded data and the parity bits, allowing for identification and rectification of errors. The LDPC codeword is storable at the memory device(s) of the memory sub-system.

Additionally, the memory sub-system controller can decode codewords, as part of a read block, stored at the memory device(s) of the memory sub-system. Decoding refers to a process of reconstructing the original embedded data (e.g., sequence of binary bits) from the codeword (e.g., the encoded original embedded data) received from storage at the memory device(s). LDPC decoding refers to a decoding method that utilizes the LDPC code to reconstruct the original embedded data.

Initially, during LDPC decoding, the LDPC codeword is compared with the expected relationships encoded in the H matrix. In particular, the LDPC codeword is multiplied by a transpose of the H matrix associated with the LDPC code used to encode the LDPC codeword. The result of the multiplication produces a vector (e.g., a syndrome vector), in which each element corresponds to a specific parity-check equation in the sparse parity-check matrix. A syndrome vector with a zero value signifies that the corresponding parity-check equation is satisfied (e.g., no errors or having even number of bit errors in the parity check equation), and a syndrome vector with a non-zero value indicates potential errors impacting the bits involved in the corresponding parity-check equation. Potential errors, for example, may be due to the bits involved in the corresponding parity-check equation being flipped due to noise, interference, distortion, bit synchronization errors or errors from the media itself (both intrinsic and extrinsic). For example, a bit that may have originally been stored as a '0' may be flipped to a '1' or vice versa.

Codeword error rate (CWER) refers to a metric used to quantify a correction capability of the decoding algorithm. Stated differently, CWER reflects the number of codewords out of a collection of codewords that have at least one bit error after the decoding process. A lower CWER implies better decoding performance and higher reliability, while a higher CWER suggests that the algorithm may struggle to effectively correct errors. With respect to using hard information with the decoding algorithm, CWER is functionally dependent on the raw-bit-error-rate (RBER), which is a raw measure of bit errors occurring in the absence of any correction.

To initiate the decoding process, the memory sub-system controller receives a codeword sent over a communication channel. The memory sub-system controller calculates a syndrome vector which indicates that the codeword includes errors. This description enhances the decoding process for LDPC codes based on the syndrome, such as LDPC codes used in the memory sub-systems.

Examples of the present disclosure are directed to efficiently mitigating a bit-flip stall condition in a bit flipping decoding process for a memory subsystem by utilizing respective bit flip criteria for different bit flip states during codeword decoding. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dies. One example of non-volatile memory devices is a negative-and (NAND) memory device. Other examples of non-volatile memory devices are described below in conjunction with FIG. 1. The dies in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), quad-level cells (QLCs) and penta-level cells (PLC's) or higher. For example, an SLC can store one bit of information and has two logic states, while the other examples can store multiple bits of information.

Low-Density Parity Check (LDPC) codes are commonly used for enabling error correction in memory subsystems. LDPC codes are a class of highly efficient linear block codes that include single parity check (SPC) codes. LDPC codes have a high error correction capability and can provide performance close to channel capacity. The MinSum algorithm (MSA), which is a simplified version of a belief propagation algorithm, can be used for decoding LDPC codes. MSA-based decoders, however, use a relatively high amount of energy per bit (e.g., pico-Joule per bit) for decoding codewords. As a result, MSA-based decoders are not well suited for energy conscious applications, such as mobile applications.

A bit flipping (BF) decoder iteratively determines an energy function for each bit in a codeword and flips the bit when the energy function satisfies a bit flipping criterion/threshold. The energy function represents the reliability of the current state of a bit, e.g., in terms of the number of satisfied parities for the bit, the number of unsatisfied parities (PC violations) for the bit, whether the current state of the bit matches the state of the bit when read from memory, etc. BF decoders use less energy per bit at the expense of providing a slightly lower error correction capability when compared to the error correction capability of MSA-based decoders.

Additionally, a BF decoder can get stuck in a stall condition, e.g., in which a pattern of the count of unsatisfied parities repeats and additional iterations of the decoder do not enable the BF decoder to further reduce the count of unsatisfied parities and complete the decoding process. When a BF decoder is in a stall condition, it often flips the same set of bits in multiple back-to-back iterations. Such stall conditions affect the Quality of Service (QOS) and latency of the memory subsystem. A BF decoder unable to exit a stall condition can trigger escalated error handling blocks, even when the raw bit error rate (RBER) is low, which results in worse QoS and higher latency.

Examples of the present disclosure address the above and other deficiencies by efficiently mitigating bit flip stalling as a result of bit flips of a bit in multiple back-to-back iterations in the BF decoding process. An iterative bit flip decoder utilizes respective bit flip criteria for different bit flip states to mitigate bit flip stall conditions during codeword decoding. This allows for different weighting to be provided for flipping a given bit based on whether it has already been flipped in a previous iteration and/or matches the original read bit, which may also provide an indication that the bit has been flipped in consecutive iterations.

Figure 1:
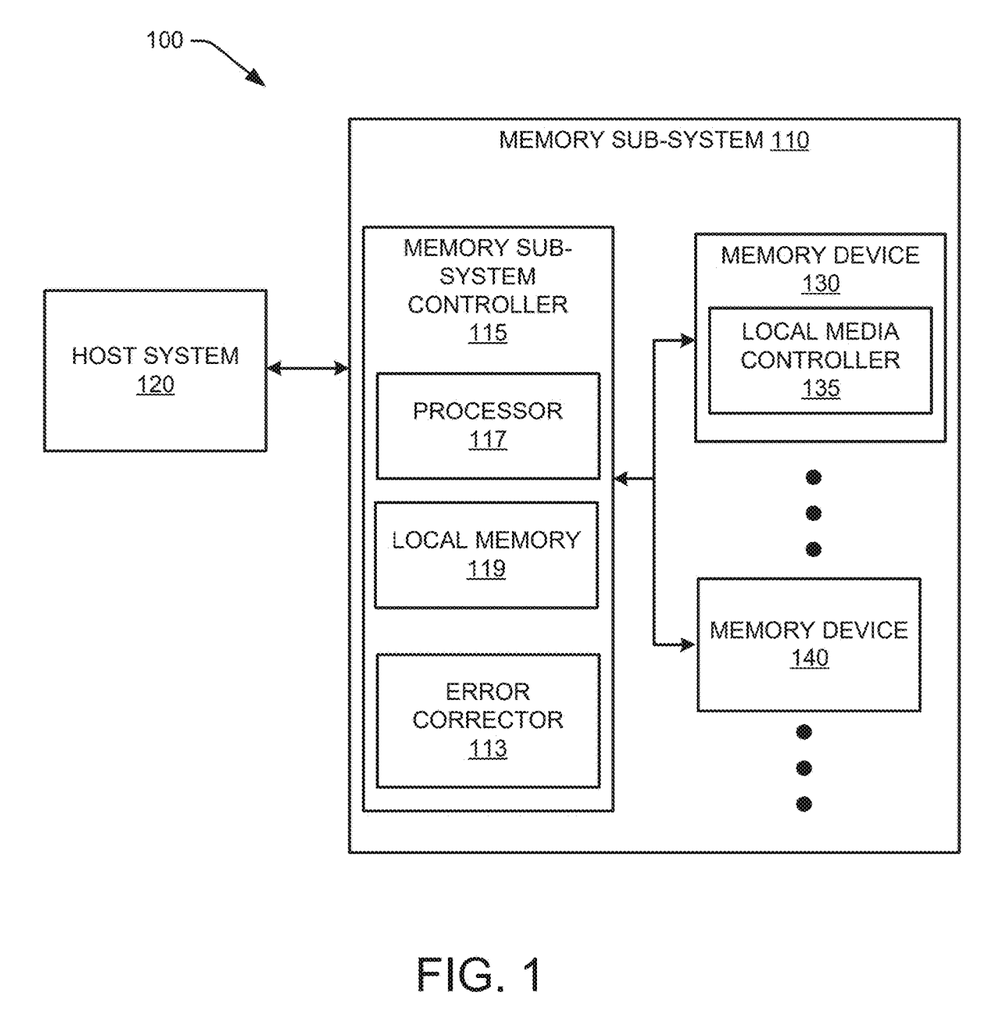
FIG. 1 illustrates an example computing system that includes a memory subsystem in accordance with some examples of the present disclosure.

FIG. 1 illustrates an example computing system 100 that includes a memory subsystem 110 in accordance with some examples of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some examples, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place block, where a non-volatile memory cell can be programmed without the non-volatile memory cell being previously erased. NAND type flash memory includes, for example, two-dimensional NAND (2D NAND) and three-dimensional NAND (3D NAND). Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform blocks such as reading data, writing data, or erasing data at the memory devices 130 and other such blocks (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the blocks described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, blocks, logic flows, and routines that control block of the memory subsystem 110, including handling communications between the memory subsystem 110 and the host system 120.

In some examples, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another example of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or blocks from the host system 120 and can convert the commands or blocks into instructions or appropriate commands to achieve the desired access to the memory devices 130 and/or the memory device 140. The memory subsystem controller 115 can be responsible for other blocks such as wear leveling blocks, garbage collection blocks, error detection and error-correcting code (ECC) blocks, encryption blocks, caching blocks, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some examples, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some examples, the memory devices 130 include local media controllers 135 that operate in conjunction with memory subsystem controller 115 to execute blocks on one or more memory cells of the memory devices 130. An external controller (e.g., memory subsystem controller 115) can externally manage the memory device 130 (e.g., perform media management blocks on the memory device 130). In some examples, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes error corrector 113 that mitigates stall conditions. In some examples, the controller 115 includes at least a portion of the error corrector 113. For example, the controller 115 can include a processor 117 (processing device) configured to execute instructions stored in local memory 119 for performing the blocks described herein. In some examples, an error corrector 113 is part of the host system 120, an application, or an operating system.

In some implementations, the error corrector 113 is operative to encode and decode data stored in the memory device (e.g., an encoder and/or decoder). Encoding data using an error correcting code (ECC) allows for correction of erroneous data bits when the data is retrieved from the memory device. For example, the error corrector 113 can encode data received from the host system 120 and store the data and parity bits as codewords in the memory device 130. The error corrector 113 decodes data stored in the memory device 130 to identify and correct erroneous bits of the data before transmitting corrected data to the host system 120. Although illustrated as a single component that can perform encoding and decoding of data, the error corrector 113 can be provided as separate components. In some examples, the error corrector 113 encodes data according to a low-density parity-check (LDPC) code. The error corrector 113 decodes the codewords stored in the memory device 130 based on a BF decoder. The error corrector 113 attempts to weight bits flipped or not flipped in a previous iteration and that are matched or not matched to the originally read bit differently in the BF decoding to mitigate a risk of a stall condition.

Figure 2:
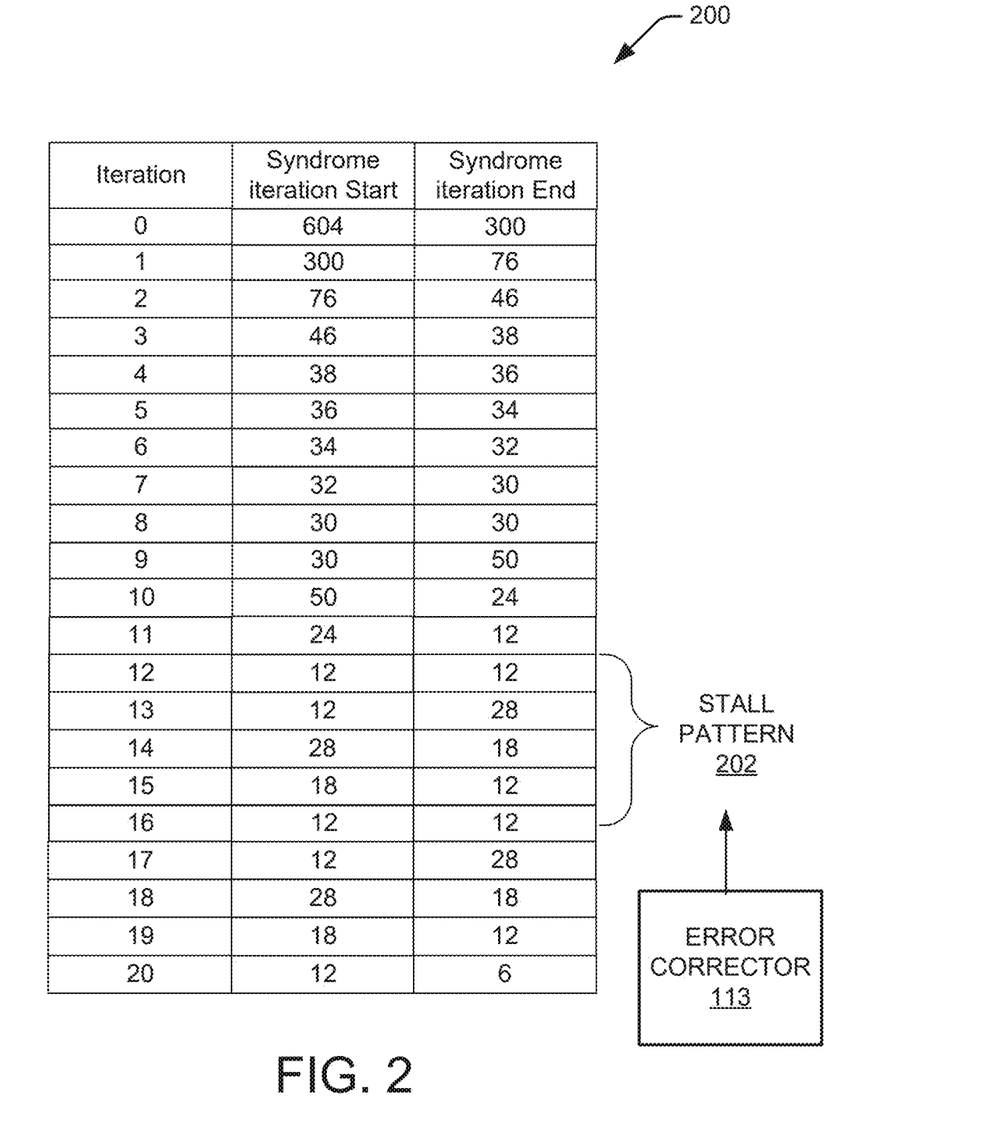
FIG. 2 illustrates a block diagram of an exemplary table including a stall pattern that is detected during error correction of a codeword in accordance with some examples.

FIG. 2 illustrates a block diagram of an exemplary table 200 including a stall pattern that is detected during error correction of a codeword, in accordance with some examples. The error corrector 113 decodes a codeword, attempting to correct errors for multiple iterations. As an example, the table 200 shows syndromes at the start and end of iterations of the error corrector 113. A syndrome indicates a number of PC violations in a codeword. At the initial iteration, 0, the syndrome weight (i.e., number of parity violations or number of non-zero syndromes) at the start of the iteration is 604 and the syndrome weight at the end of the iteration is 300. The error corrector 113 performs a subsequent error correction iteration, iteration 1. At iteration 1, a syndrome weight iteration start is 300 and a syndrome weight iteration end is 76. In this example, the BF decoding process of the error corrector 113 starts oscillating (i.e., enters a stall condition) at iteration 12 and the period of oscillation is 4. The stall pattern 202 can be repeated a second time (from iteration 16 to iteration 19).

In one example, the error corrector 113 tracks the syndrome weight for each of a number of sequential iterations and determines there is a risk of stall condition when detecting repetition of syndrome values, such as stall pattern 202. In other examples, the error corrector 113 determines there is a risk of a stall condition when the iteration count satisfies a threshold value (e.g., the iteration count reaches or exceeds a threshold value). Upon detecting the risk of a stall condition, the error corrector 113 can execute one or more bit flipping rules (e.g., preventing oscillating between back-to-back bit flips over multiple iterations without error improvement), to attempt to break out of the stall condition at the end of iteration 20. Alternatively, the bit flipping rules can be employed during the entire decoding process as opposed to being invoked upon the detection of a possible stall condition to mitigate the potential of a stall condition.

The bit flip rules can provide respective bit flip criteria for different bit flip states for each bit that has an error indication (e.g., a PC violation). In one example, a first bit flip state and an associated flip bit criteria value is assigned to a matched state and a flipped in a previous iteration state, a second flip bit state and an associated flip bit criteria value is assigned to a matched state and a not flipped in a previous iteration state, a third bit flip state and an associated third bit flip criteria value is assigned to an unmatched state and a flipped in a previous iteration state, and a fourth bit state and an associated flip criteria value is assigned to an unmatched state and the not flipped in the previous iteration state. A bit flip criteria value could be a number of PC violations of a given bit for a codeword determined based on a parity check associated with the given bit. Each bit flip criteria can have a different PC violation threshold, which determines whether or not the bit will be flipped in the current iteration. That is if a current parity check value is greater than or equal to the determined bit flip criteria value it will be flipped whether or not it was flipped in the previous iteration. If a current parity check value is less than the determined bit flip criteria value then the bit will not be flipped regardless of whether or not it was flipped in the current iteration.

Figure 3:
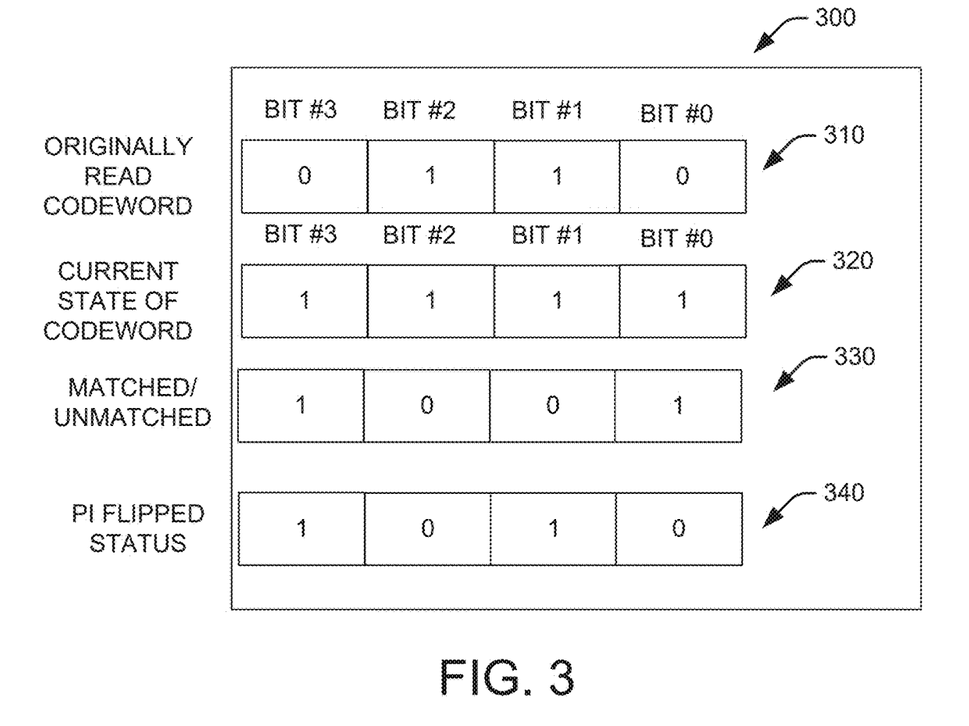
FIG. 3 illustrates example data structures employed by a bit flip decoder executed by a processor to resolve errors in codewords.

FIG. 3 illustrates example data structures employed by a bit flip decoder executed by a processor to resolve errors in codewords. The data structures are employed by the bit flip decoder during the bit flip decoding process and can reside in a local memory 300 (similar to the local memory 119 of FIG. 1). Each data structure is represented by four bits (labeled as Bit #3-Bit #0) for exemplary purposes but could be any number of bits or bytes that represent a codeword. The codeword includes both data bits and parity bits. A first data structure 310 retains the originally read codeword read from a memory device such as the memory device 130 shown in FIG. 1. The originally read codeword is shown as 0, 1, 1, 0. A second data structure 320 retains the current state of the codeword during the bit flip decoding process. The current state of the codeword is shown as 1, 1, 1, 1.

A third data structure 330 retains a matched/unmatched indicator bit for each bit of the codeword. The matched/unmatched indicator bit is determined by comparing each respective bit of the originally read codeword and the current state of the codeword to provide the resultant first indicator bit for each bit of the codeword. The present example provides a '0' for a matched bit and a '1' for an unmatched bit. The third data structure 330 is shown as 1, 0, 0, 1 indicating that the original read codeword and the current state of the codeword for Bit #3 and Bit #0 don't match and do match for Bit #2 and Bit #1. Alternatively, the bit flip decoder can determine if the current state of the bit matches the original state of the bit during execution without retaining a third data structure by comparing bits of the originally read codeword and the current state of the codeword. A fourth data structure 340 retains whether a bit has not been flipped or has been flipped in a previous iteration. The present example provides a '0' for a bit that has not been flipped in the previous iteration and a '1' for a bit that has been flipped in the previous iteration. The fourth data structure 340 shows that Bit #2 and Bit #0 have not been flipped in the previous iteration and Bit #3 and Bit #1 have been flipped in the previous iteration. If the bit is in a '1' state and has not been flipped in a previous iteration, then the corresponding bit in the fourth data structure 340 is reset to a '0' state for the next iteration.

As shown in FIG. 3, each bit of a codeword is assigned a first indicator bit to determine if the current bit is in a matched or unmatched state and a second indicator bit to determine if the current bit has been flipped or not flipped in the previous bit flipping iteration. The first and second indicator bits form a bit flip state indicator pair that can be a set of binary values (e.g., 0,0; 0,1; 1,0; and 1,1) with each set of binary values defining one of four different bit flip states. Each different bit flip state can be associated with a different bit flip criteria threshold value (e.g., based on a number of PC violations). Each different bit flip indicator pair can be employed by a bit flip decoder to look up the associated bit flip criteria threshold and compare it to a current determined bit flip criteria value to determine if a bit should be flipped in the current bit flipping iteration. The bit flip criteria value can be set differently for each bit flip state to mitigate bit flip stall conditions where a bit flips back and forth multiple times without reducing the number of bit errors over multiple iterations. This can be repeated for every bit in a codeword that has an associated parity check error, until all errors have been corrected or the bit flipping process reaches a maximum number of bit flip iterations, a maximum time period is reached or some other stop condition/criteria.

Figure 4:
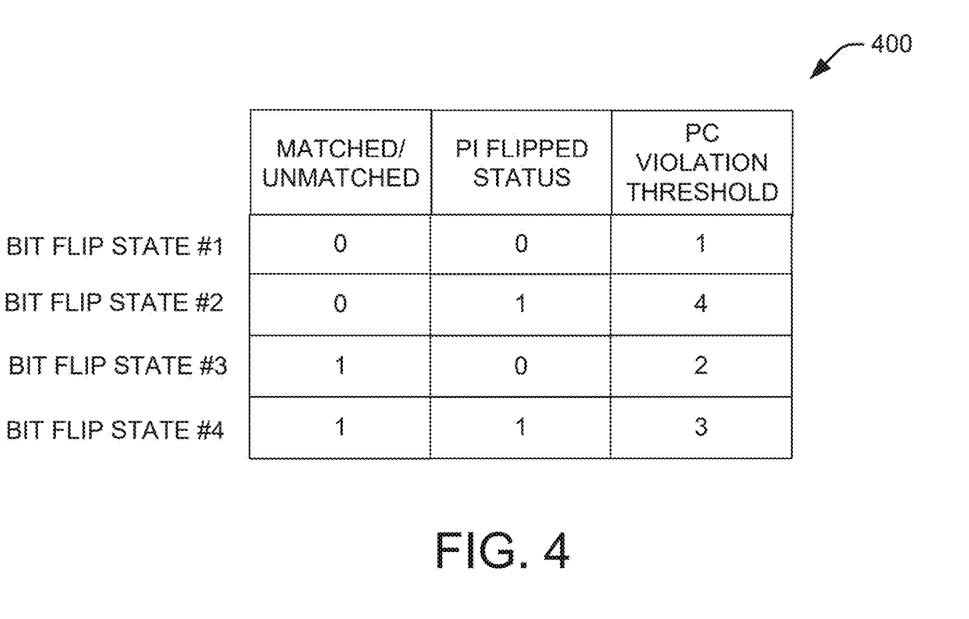
FIG. 4 illustrates an example of an index table for referencing parity check (PC) violation thresholds based on an associated bit flip state.

FIG. 4 illustrates an example of an index table 400 for referencing PC violation thresholds based on an associated bit flip state. A bit flip state #1 (0, 0) is assigned to a matched state and a not flipped in a previous iteration state, a bit flip state #2 (0, 1) is assigned to a matched state and a flipped in a previous iteration state, a bit flip state #3 (1, 0) is assigned to an unmatched state and a not flipped in a previous iteration state, and bit flip state #4 (1, 1) is assigned to an unmatched state and a flipped in the previous iteration state. In the example of FIG. 4, each bit flip state is assigned a different PC violation threshold, which provides a different weighting for each bit flip state to require a different number of PC violations before a bit will be flipped in the current iteration. The present examples show parity check threshold values that range from 1 to 4, such that the codeword utilized regular LPDC codes that have H matrices with regular column widths. However, the codewords could range some other number of column widths and utilize irregular LPDC codes that have H matrices with irregular column widths.

In the present example, bit flip state #1 has a PC violation threshold of 1, such that a parity check only needs to have a single PC violation for the bit flip decoder to determine that this bit should be flipped in the current iteration. In this example, the bit flip state #1 provides an indication that bit matches the originally read bit of the codeword and has not been flipped in a previous iteration state, such that it should have a relatively low PC violation threshold to flip in the current iteration. The bit flip state #2 is assigned to a matched state and a flipped in a previous iteration state, which indicates that it has likely been flipped more than once in subsequent iterations since it is now matched but just flipped, so the PC violation threshold has been set much higher at 4 PC violations before the bit is flipped in the current iteration. Bit flip state #3 (1, 0) is assigned to an unmatched state and a not flipped in a previous iteration state with a PC violation threshold of 2 and bit flip state #4 is assigned to an unmatched state and a flipped in the previous iteration state so the PC violation is 3, so a bit in that state would require a higher number of PC violations to flip than a bit in bit flip state #3. PC violation threshold can be a function of iterations and different from one iteration to another. In this example, there are 4 states corresponding to the two state bits of matched/unmatched and previous iteration flipped status. We can increase the number of states and hence the number of bit flipping criteria by checking whether the bit is flipped in previous two iterations as opposed to only previous iteration. Different methods can be devised to extract this information. The important point is to associate different bit flipping criteria to flip status bit/bits.

Figure 5:
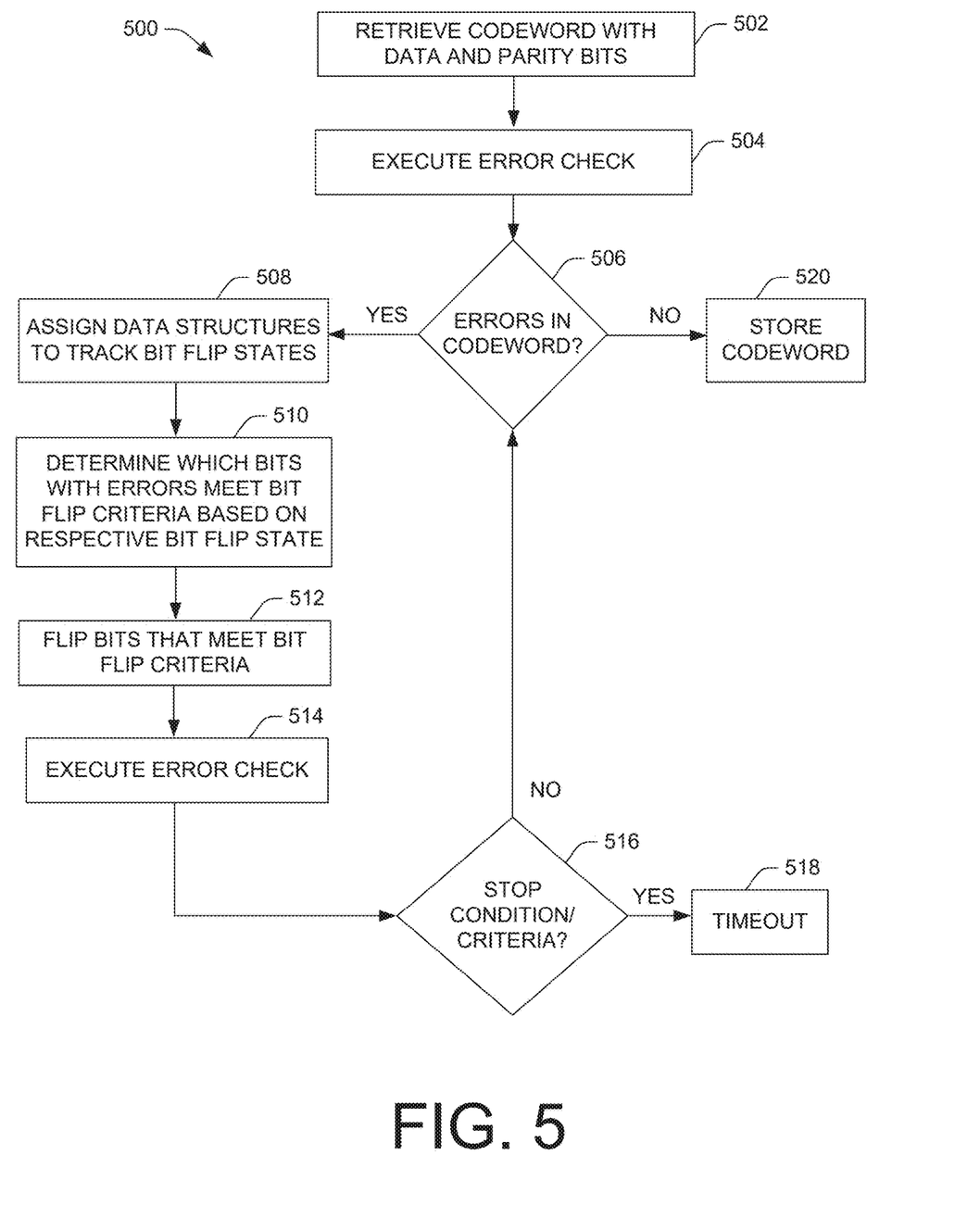
FIG. 5 is a flow diagram of an example method to mitigate a stall condition in iterative decoders by mitigating multiple back-to-back bit flips in accordance with some examples of the present disclosure.

FIG. 5 is a flow diagram of an example method 500 to mitigate a stall condition in a decoder of a memory subsystem in accordance with some examples of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some examples, the method 500 is performed by the error corrector 113 of FIG. 1. Although shown in a particular sequence or order, unless otherwise specified, the order of the processes can be modified. Thus, the illustrated examples should be understood only as examples, and the illustrated processes can be performed in a different order, and some processes can be performed in parallel. Additionally, one or more processes can be omitted in various examples. Thus, not all processes are required in every example. Other process flows are possible.

At block 502, the processing device or controller receives a codeword from a memory device, e.g., memory device 130 or memory device 140. In some examples, the codeword is received as a result of the execution of a read request from a host system 120. The codeword includes a combination of data bits and parity check bits. For example, the parity check bits are stored in the memory device along with the data bits.

At block 504, the processing device executes an error check process such as an LPDC decode process to determine if there are errors in the codeword. At block 506, the method determines if there are errors in the codeword. If there is no errors in the codeword (NO), the method proceed to block 520 to store the codeword for further processing or communications. The next codeword can be read and the method 500 repeated until each codeword has been stored or a timeout condition has occurred.

If there are errors in the codeword (YES, which corresponds to the case that the syndrome weight is non-zero), the method proceeds to block 508 where data structures are assigned to track bit flip states, such as data structure 310, 320, 330 and 340 as shown in FIG. 3. The method then advances to block 510 to determine which bits with errors meet bit flip criteria based on their respective bit flip state. For example, the bit flip states can be identified by a first and second indicator bits that form a binary indicator pair that can be a set of binary values (e.g., 0,0; 0,1; 1,0; and 1,1) with each set of binary values defining one of four different bit flip states as shown in FIG. 3. Each different bit flip state can be associated with a different bit flip criteria threshold value (e.g., based on a number of PC violations) as shown in FIG. 4. At block 512, the processor via the error corrector 113 proceeds with an iteration of bit flipping decoding on the codeword. For example, the error corrector 113 includes or uses a bit flipping decoder that performs an iteration of the decoding process, flipping bits within the codeword based on which bits with errors meet the bit flip criteria based on their respective bit flip states. The processing device performs an error correction iteration on the codeword to obtain an initial corrected codeword. During an iteration, the processing device determines locations of potentially erroneous bits in the codeword and flips one or more of these bits to obtain an updated codeword (e.g., using an energy function and bit flipping criterion, as described above). For example, the error corrector 113 flips bits in the codeword during iteration 0 of table 200. The method then proceeds to block 514 to re-execute the error check the same as the one executed in block 504.

Upon completing an iteration at block 512 and re-executing the error check at block 514 on the initial corrected codeword, the processor determines whether a stop condition/criterion is satisfied at block 516. If a stop condition is not determined at block 516 (NO), the method proceeds back to 506 and repeats blocks 508-516 for the next iteration if errors remain in the corrected codeword or to block 520 to store the codeword if no errors are detected in the corrected codeword. If a stop condition is determined at block 516 (YES), the method proceeds to provide a timeout indication at block 518.

A stop condition/criterion can include an indication that no errors are detected for the codeword. In some examples, the stop criterion can include a null syndrome indicating that the codeword no longer includes erroneous bits. In some examples, the stop condition/criterion can include a maximum number of iterations (i.e., the maximum iteration count) or a maximum amount of time. For example, the processing device is operative to perform the maximum number of iterations (e.g., 30 iterations, 40 iterations, 100 iterations, etc.), and when this number of iterations is performed, the resulting codeword is output, regardless of whether the codeword still includes erroneous bits or not. When the stop condition/criterion is satisfied, the error corrector 113 outputs the corrected codeword or an indication of failure if the processing device was unable to decode the codeword and provides a timeout indication at 518. For example, the error corrector 113 can transmit the corrected codeword to the host 120. In another example, an indication of failure can trigger a different error correction process or the transmission of an error message to the host 120.

Alternatively, the processor can detect a risk of a stall condition as a stop condition or criteria and proceed to block 518 to issue a timeout indication. In other examples, bit flip decoding can be performed after block 506 to correct errors in the codeword without executing blocks, 508, 510, and 512 until a risk of a stall condition has been detected, thus triggering these processes and the utilization of bit flip states and respective bit flip criteria associated with the bit flip states. In some examples, the processing device detects a risk of a stall condition by monitoring syndromes that result from the error correction of the codeword in the multiple iterations, and detecting a stall pattern, e.g., stall pattern 202, in the syndromes that result from the error correction of the codeword in consecutive iterations from the multiple iterations. For example, the error corrector 113 can store multiple consecutive syndromes generated during iterations of error correction of a codeword and compare successive sets of these syndromes to identify a stall pattern that repeats over multiple sets of iterations. The error corrector 113 can identify the stall pattern 202 as a repeating pattern between iterations 12-15 and iterations 16-19.

In some examples, the processing detects a risk of the stall condition in multiple iterations by hashing multiple syndromes that result from the error correction of the codeword in the multiple iterations and comparing the hash value with a hash value resulting from hashing other syndromes resulting from the error correction of the codeword in other iterations. For example, the error corrector 113 can generate a hash value from the syndromes of iterations 12-15, and another hash value from the syndromes of iterations 16-19. The error corrector 113 compares the two hash values to determine that the iterations 12-15 and the iterations 16-19 have a similar pattern that is repeating.

In another example, the processing device detects a risk of a stall condition by determining an iteration count threshold is satisfied. A BF decoder usually corrects errors quickly and a current iteration count that does not trigger a stopping criterion but is equal to or greater than the iteration count threshold can indicate a potential stall condition. For example, referring to table 200, the error corrector 113 can use an iteration count threshold of 19 iterations.

In yet another example, the processing device detects a risk of a stall condition by determining an iteration count threshold is satisfied and a PC violation count threshold is satisfied. A small number of PC violations at or above a threshold iteration count can also indicate a potential stall condition. Continuing the example above, referring to table 200, the error corrector 113 can use an iteration count threshold of 19 iterations. In detecting the PC violation count threshold being satisfied (e.g., a syndrome less than or equal to 20 for table 200) when the iteration count threshold is also satisfied (e.g., a current iteration count of 19 or more iterations), the error corrector 113 determines that a stall condition is present.

In some examples, the processing device detects a risk of a stall condition using a combination of one or more thresholds and monitoring syndromes for a repeating pattern. For example, the error corrector 113 can store and compare groups of consecutive syndromes in response to determining an iteration count threshold is satisfied and/or an iteration count threshold and PC violation count threshold is satisfied.

The methodology of FIG. 5 illustrates a methodology of determining errors in a codeword and flipping all bits that have errors that meet their respective bit flip criteria in a given iteration for each iteration. However, in some examples, it is more efficient to execute an error check on a codeword and selectively flip bits individually in a given iteration, and then repeat the error check and individual bit flipping in a subsequent iteration until all bit errors have been resolved.

Figure 6:
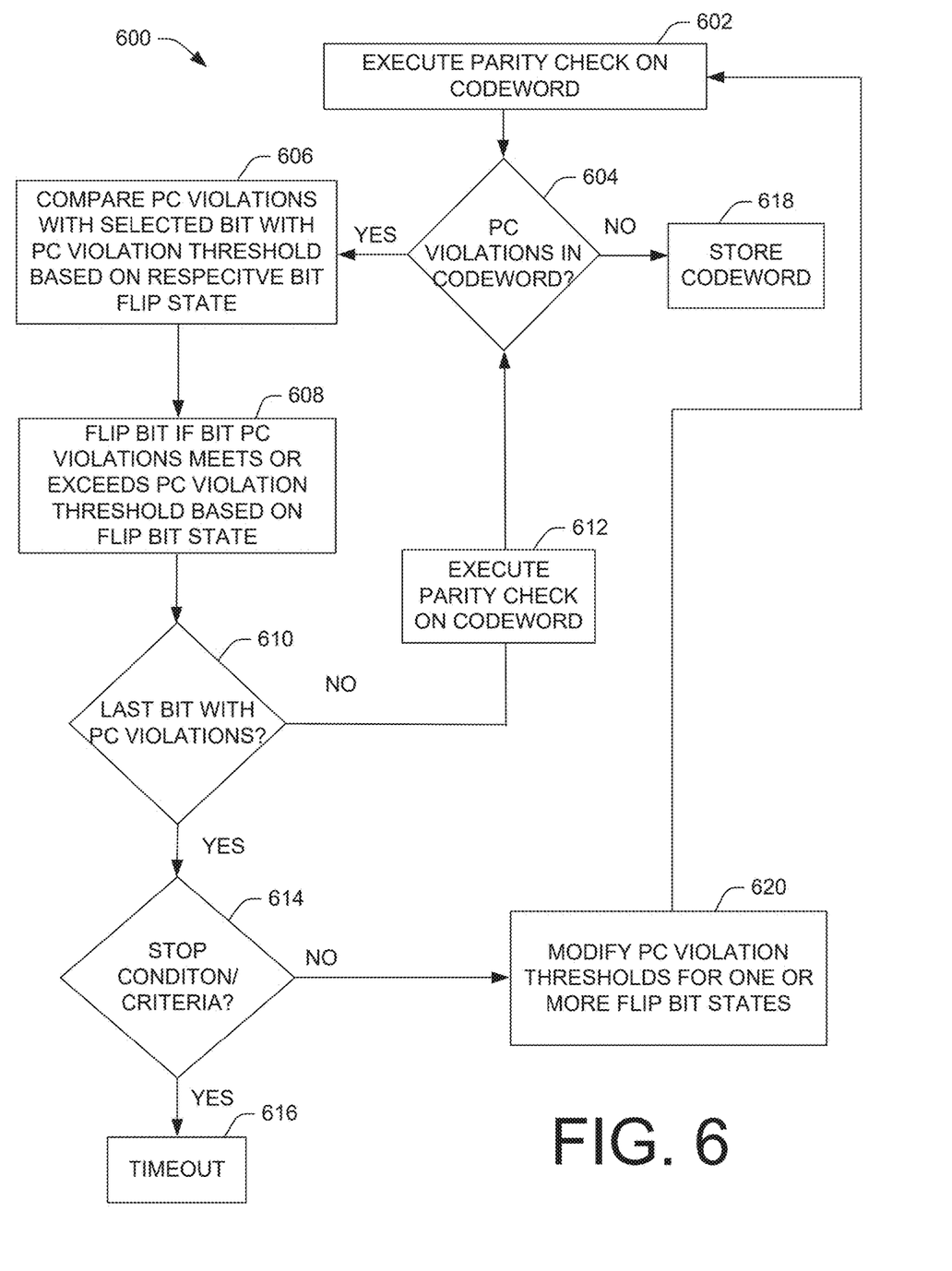
FIG. 6 is a flow diagram of another example method to mitigate a stall condition in iterative decoders by mitigating multiple back-to-back bit flips in accordance with some examples of the present disclosure.

FIG. 6 is a flow diagram of another example method 600 to mitigate a stall condition in iterative decoders in accordance with some examples of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some examples, the method 600 is performed by the error corrector 113 of FIG. 1. Although shown in a particular sequence or order, unless otherwise specified, the order of the processes can be modified. Thus, the illustrated examples should be understood only as examples, and the illustrated processes can be performed in a different order, and some processes can be performed in parallel. Additionally, one or more processes can be omitted in various examples. Thus, not all processes are required in every example. Other process flows are possible.

At block 602, the processing device executes a parity check on a received codeword. The parity check can be based on an LPDC decode process to determine if there are errors in the codeword. The codeword can be received from a memory device, e.g., memory device 130 or memory device 140. In some examples, the codeword is received as a result of the execution of a read request from a host system 120. The codeword includes a combination of data bits and parity check bits. For example, the parity check bits are stored in the memory device along with the data bits.

At block 604, the method determines if there are PC violations in the codeword. If there is no PC violation in the codeword (NO, i.e., zero syndrome weight), the method proceeds to block 618 to store the codeword for further processing or communications. The next codeword can be received and the method 600 repeated until each codeword has been stored or a timeout condition has occurred.

If there are PC violations in the codeword (YES, i.e., non-zero syndrome weight), the method proceeds to block 606. At block 606, a bit is selected for bit flipping and the PC violations of the selected bit are compared with PC violation thresholds based on the respective bit flip state. For example, the bit flip states can be identified by a first and second indicator bits that form a binary indicator pair that can be a set of binary values (e.g., 0,0; 0,1; 1,0; and 1,1) with each set of binary values defining one of four different bit flip states as shown in FIG. 3. Each different bit flip state can be associated with a number of PC violations as shown in FIG. 4.

At block 608, the processor or controller via the error corrector 113 proceeds to flip that selected bit if the PC violations of the selected bit meet or exceed the PC violation thresholds based on the flip bit state of the selected bit, it also updates the states of the bit described at FIG. 3, i.e., it updates the "MATCHED/MISMATCHED" state (330 in FIG. 3) and previous iteration flipped status ("PI FLIPPED STATUS" 340 in FIG. 3). The methodology then proceeds to block 610. At block 610, a determination is made of whether or not the last bit with parity threshold violations in the codeword has been selected for bit flip determination. If the last bit with parity threshold violations has not been selected for bit flip determination (NO), the method proceeds to block 612 to re-execute the parity check on the codeword if the selected bit has been flipped or block 612 is bypassed if the selected bit has not been flipped. The process then returns to block 604 to repeat the process of blocks 606-610 for the next selected bit with a PC violation or to store the codeword in 618 if all errors have been resolved. This process can improve the process time for codewords with a small number of errors compared to the process of FIG. 5, since in some cases correcting one bit can remove parity code violations for another bit, such that a separate determination process for all bits with PC violations can be eliminated by correcting selected bits with PC violations individually.

If the last bit with parity threshold violations has been selected for bit flip determination (YES), the processor determines whether a stop condition/criterion is satisfied at block 614. If a stop condition is determined at block 516 (YES), the method proceeds to provide a timeout indication at block 616. The possible stop conditions/criteria can be similar to the ones described with respect to methodology of FIG. 5. If a stop condition is not determined at block 516 (NO), the method proceeds block 620. At 620, the PC violation thresholds can be modified for one or more bit flip states. For example, for a set of thresholds as shown in FIG. 4, bit flip state #1 has a PC violation threshold of 1, which could be changed to 2, bit flip state #2 has a PC violation threshold of 4 which could be changed to 3, bit flip state #3 has a PC violation threshold of 2 which could stay the same and bit flip state #4 has a PC violation threshold of 3 which could stay the same. The change of PC violation thresholds could facilitate codeword error correction convergence in certain situations. The method then returns to 602 to repeat the method 600 with the new PC violation thresholds.

Figure 7:
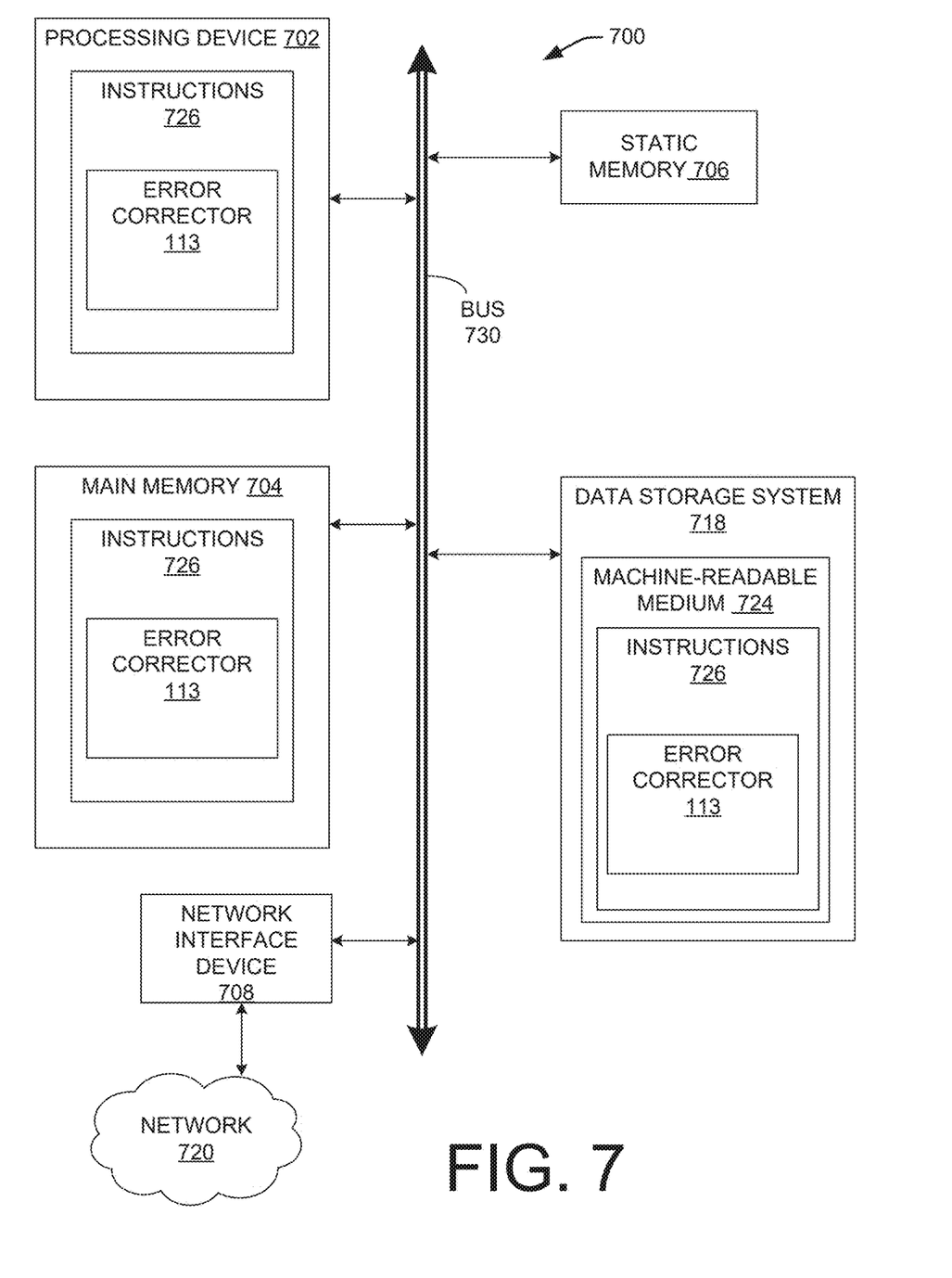
FIG. 7 is a block diagram of an example computer system in which examples of the present disclosure can operate.

FIG. 7 illustrates an example machine of a computer system 700 within which a set of instructions for causing the machine to perform any one or more of the methodologies discussed herein, can be executed. In some examples, the computer system 700 can correspond to a host system (e.g., the host system 120 of FIG. 1) that includes, is coupled to, or utilizes a memory subsystem (e.g., the memory subsystem 110 of FIG. 1) or can be used to perform the blocks of a controller (e.g., to execute an operating system to perform blocks corresponding to the error corrector 113 of FIG. 1). In alternative examples, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. In other embodiments the machine may be a computer within an automotive, a data center, a smart factory, or other industrial applications. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the blocks and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory subsystem 110 of FIG. 1.

In one example, the instructions 726 include instructions to implement functionality corresponding to an error corrector (e.g., the error corrector 113 of FIG. 1). While the machine-readable storage medium 724 is shown in an example to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of blocks on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of blocks leading to a desired result. The blocks are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the blocks herein. This apparatus can be specially constructed for the intended purposes, or it can include a general-purpose computer selectively activated or reconfigured by a computer program stored in the computer. For example, a computer system or other data processing system, such as the controller 115, can carry out the computer-implemented methods 500 and 600 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some examples, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" means includes but not limited to, the term "including" means including but not limited to. The term "based on" means "based at least in part on". Additionally, where the disclosure or claims recite "a," "an," "a first" or "another" element, or the equivalent thereof, it should be interpreted to include one or more than one such element, neither requiring nor excluding two or more such elements.

What is claimed is:

1. A method comprising:
   storing a codeword having a plurality of bits received from a memory device in a first data structure to be decoded by flipping one or more of the plurality of bits over multiple iterations by a bit flip decoder;
   executing an error check on the codeword, by a controller, to identify error bits from the plurality of bits; and
   flipping the state of an error bit for one of the identified error bits if parity check (PC) violations associated with the error bit meets or exceeds a PC violation threshold associated with a bit flip state of the error bit, where the bit flip state is selected from one of a first bit flip state with a first PC violation threshold and a second bit flip state with a second PC violation threshold different than the first PC violation threshold; and
   storing the current state of the error bit in a second data structure.

2. The method of claim 1, wherein the first bit flip state identifies that the error bit was flipped in the previous bit flip iteration and the second bit flip state identifies that error bit was not flipped in the previous bit flip iteration.

3. The method of claim 1, wherein the bit flip state is further selected from a third bit flip state with a third PC violation threshold and a fourth bit flip state with a fourth PC violation threshold.

4. The method of claim 3, wherein a matched state is defined as when a corresponding bit in the first data structure matches the corresponding bit in the second data structure and an unmatched state is when a corresponding bit in the first data structure does not match the corresponding bit in the second data structure, wherein the first bit flip state identifies a matched state and a flipped in a previous iteration state, the second bit flip state identifies a matched state and not flipped in a previous iteration state, the third bit flip state identifies an unmatched state and a flipped in a previous iteration state, and the fourth bit flip state identifies an unmatched state and not flipped in the previous iteration state.

5. The method of claim 4, wherein the error check is a low density parity check (LDPC).

6. The method of claim 4, further comprising:
storing in a third data structure a matched/unmatched state of each bit of the codeword; and
storing in a fourth data structure a flipped/not flipped in the previous iteration state of each bit of the codeword wherein a bit from the third data structure and its corresponding bit from the fourth data structure form a bit flip state indicator pair that is utilized to reference a corresponding bit flip criteria value.

7. The method of claim 1, further comprising flipping the state of an error bit from one of the identified error bits for each respective identified error bit in the code word if the respective identified error bit meets or exceeds a PC violation threshold associated with its current bit flip state, until each error bit has been flipped or not flipped based on the determination of whether or not the respective error bit meets or exceeds a PC violation threshold associated with its given bit flip state.

8. The method of claim 7, further comprising:
re-executing an error check after one error bit has been flipped or not flipped or after each error bit has been flipped or not been flipped; and
repeating iterations of the decoding operations until a stop condition/criteria has occurred or all errors in the code have been resolved wherein a PC violation threshold for one or more bit flip states are changed after a given number of bit flip iterations prior to an occurrence of a stop condition/criteria or prior to a resolution of all errors in the codeword.

9. A non-transitory computer-readable storage medium comprising instructions that, when executed by a processing device, cause the processing device to:
store a received codeword that includes a plurality of bits from a memory device in a first data structure to be decoded by flipping one or more of the plurality of bits over multiple iterations by a bit flip decoder;
execute an error check on the codeword, by a controller, to identify error bits from the plurality of bits;
flip the state of an error bit for one of the identified error bits if parity check (PC) violations associated with the error bit meets or exceeds a PC violation threshold associated with a bit flip state of the error bit, where the bit flip state is selected from one of a first bit flip state with a first PC violation threshold and a second bit flip state with a second PC violation threshold different than the first PC violation threshold; and
store the current state of the error bit in a second data structure.

10. The non-transitory computer-readable storage medium of claim 9, wherein the bit flip state is further selected from a third bit flip state with a third PC violation threshold and a fourth bit flip state with a fourth PC violation threshold.

11. The non-transitory computer-readable storage medium of claim 10, wherein a matched state is defined as when a corresponding bit in the first data structure matches the corresponding bit in the second data structure and an unmatched state is when a corresponding bit in the first data structure does not match the corresponding bit in the second data structure, wherein the first bit flip state identifies a matched state and a flipped in a previous iteration state, the second bit flip state identifies a matched state and not flipped in a previous iteration state, the third bit flip state identifies an unmatched state and a flipped in a previous iteration state, and the fourth bit flip state identifies an unmatched state and not flipped in the previous iteration state.

12. The non-transitory computer-readable storage medium of claim 11, wherein the error check is a low density parity check (LDPC).

13. The non-transitory computer-readable storage medium of claim 11, wherein the processing device is further to:
store in a third data structure a matched/unmatched state of each bit of the codeword; and
store in a fourth data structure a flipped/not flipped in the previous iteration state of each bit of the codeword wherein a bit from the third data structure and its corresponding bit from the fourth data structure form a bit flip state indicator pair that is utilized to reference a corresponding bit flip criteria value.

14. The non-transitory computer-readable storage medium of claim 9, wherein the processing device is further to: flip the state of an error bit from one of the identified error bits for each respective identified error bit in the code word if the respective identified error bit meets or exceeds a PC violation threshold associated with its current bit flip state, until each error bit has been flipped or not flipped based on the determination of whether or not the respective error bit meets or exceeds a PC violation threshold associated with its given bit flip state.

15. The non-transitory computer-readable storage medium of claim 14, wherein the processing device is further to:
re-execute an error check after one error bit has been flipped or not flipped or after each error bit has been flipped or not been flipped; and
repeat iterations of the decoding operations until a stop condition/criteria has occurred or all errors in the code have been resolved wherein a PC violation threshold for one or more bit flip states are changed after a given number of bit flip iterations prior an occurrence of a stop condition/criteria or prior to a resolution of all errors in the codeword.

16. A system comprising:
a memory device; and
a processing device, operatively coupled with the memory device, to:
store a received codeword that includes a plurality of bits from a memory device in a first data structure to be decoded by flipping one or more of the plurality of bits over multiple iterations by a bit flip decoder;
execute an error check on the codeword, by a controller, to identify error bits from the plurality of bits;
flip the state of an error bit for one of the identified error bits if parity check (PC) violations associated with the error bit meets or exceeds a PC violation threshold associated with a bit flip state of the error bit, where the bit flip state is selected from one of a first bit flip state with a first PC violation threshold and a second bit flip state with a second PC violation threshold different than the first PC violation threshold; and
store the current state of the error bit in a second data structure.

17. The system of claim 16, wherein a matched state is defined as when a corresponding bit in the first data structure matches the corresponding bit in the second data structure and an unmatched state is when a corresponding bit in the first data structure does not match the corresponding bit in the second data structure, wherein the first bit flip state identifies a matched state and a flipped in a previous iteration state, the second bit flip state identifies a matched state and not flipped in a previous iteration state, a third bit flip state identifies an unmatched state and a flipped in a previous iteration state, and a fourth bit flip state identifies an unmatched state and not flipped in the previous iteration state.

18. The system of claim 16, wherein the error check is a low density parity check (LDPC).

19. The system of claim 16, wherein the processing device is further to flip the state of an error bit from one of the identified error bits for each respective identified error bit in the codeword if the respective identified error bit has PC violations that meet or exceed a PC violation threshold associated with its current bit flip state for each of the identified error bits.

20. The system of claim 16, wherein the processing device is further to:
- re-execute an error check after one error bit has been flipped or not flipped or after each error bit has been flipped or not been flipped; and
- repeat iterations of the decoding operations until a stop condition/criteria has occurred or all errors in the code have been resolved wherein PC violation threshold for one or more bit flip states are changed after a given number of bit flip iterations prior to an occurrence of a stop condition/criteria or prior to resolution of all errors in the codeword.

* * * * *